(12) United States Patent
Takahashi

(10) Patent No.: US 10,518,660 B2
(45) Date of Patent: Dec. 31, 2019

(54) POWER CONVERTER

(71) Applicant: Fuji Electric Co., Ltd., Kanagawa (JP)

(72) Inventor: Kiyoshi Takahashi, Kanagawa (JP)

(73) Assignee: FUJI ELECTRIC CO., LTD., Kanagawa (JP)

(*) Notice: Subject to any disclaimer, the term of this patent is extended or adjusted under 35 U.S.C. 154(b) by 2 days.

(21) Appl. No.: 16/028,975

(22) Filed: Jul. 6, 2018

(65) Prior Publication Data
US 2019/0047424 A1 Feb. 14, 2019

(30) Foreign Application Priority Data

Aug. 14, 2017 (JP) .................. 2017-156593

(51) Int. Cl.
| B60L 53/20 | (2019.01) |
| B60L 53/22 | (2019.01) |
| B60L 5/18 | (2006.01) |
| B60M 1/12 | (2006.01) |
| H05K 5/02 | (2006.01) |
| H05K 5/00 | (2006.01) |
| B61C 3/00 | (2006.01) |
| H05K 7/18 | (2006.01) |
| B61C 17/04 | (2006.01) |
| H02B 1/26 | (2006.01) |

(52) U.S. Cl.
CPC .............. *B60L 53/22* (2019.02); *B60L 5/18* (2013.01); *B60M 1/12* (2013.01); *B61C 3/00* (2013.01); *B61C 17/04* (2013.01); *H02B 1/26* (2013.01); *H05K 5/0021* (2013.01); *H05K 5/0204* (2013.01); *H05K 7/18* (2013.01); *B60L 2200/26* (2013.01); *H05K 5/0213* (2013.01)

(58) Field of Classification Search
CPC ........ B60L 53/22; B60L 5/18; B60L 2200/26; B60M 1/12; B61C 3/00; B61C 17/04; H02B 1/26; H05K 5/0021; H05K 5/0204; H05K 7/18
See application file for complete search history.

(56) References Cited

U.S. PATENT DOCUMENTS

| 2001/0030881 A1* | 10/2001 | Yamaguchi | ............... B60L 9/24 363/124 |
| 2010/0212539 A1* | 8/2010 | Iden | ............... B61C 3/00 105/35 |
| 2011/0122669 A1* | 5/2011 | Santos | ............... H02M 7/003 363/141 |
| 2013/0016481 A1* | 1/2013 | Takahashi | ............... H05K 7/1432 361/724 |
| 2013/0092045 A1* | 4/2013 | Takahashi | ............... B60L 9/18 105/49 |

(Continued)

FOREIGN PATENT DOCUMENTS

JP 2009-96460 A 5/2009

*Primary Examiner* — Binh B Tran
*Assistant Examiner* — Douglas R Burtner
(74) *Attorney, Agent, or Firm* — Chen Yoshimura LLP

(57) ABSTRACT

A power converter includes a chassis having attached thereto a holding fixture for mounting the chassis to a mounting portion in a suspended manner. The holding fixture includes a first member attached to a first surface of the chassis which faces the mounting portion, and a second member attached to the first member and a second surface of the chassis that adjoins the first surface.

11 Claims, 14 Drawing Sheets

(56) References Cited

U.S. PATENT DOCUMENTS

| | | | |
|---|---|---|---|
| 2014/0156135 A1* | 6/2014 | Maki | G07C 5/008 |
| | | | 701/29.1 |
| 2014/0345492 A1* | 11/2014 | Fujito | H02P 27/06 |
| | | | 105/61 |
| 2015/0062811 A1* | 3/2015 | Suzuki | B61C 3/00 |
| | | | 361/690 |

* cited by examiner

POWER CONVERTER

BACKGROUND OF THE INVENTION

Technical Field

The present invention relates to a power converter to be installed in a railway vehicle, for example.

Background Art

One example of a previously proposed power converter to be mounted on the underfloor of a railway vehicle is the railway vehicle underfloor device disclosed in Patent Document 1.

This railway vehicle underfloor device includes a chassis including a bottom wall unit, sidewall units, a top wall unit, and partition wall units, and four hanging lugs are respectively fixed to each of the front and rear edges of the top wall unit at a prescribed interval in the lengthwise direction (for a total of eight hanging lugs). These hanging lugs are fixed to the underfloor of the railway vehicle using bolts or the like, thereby fixing the chassis to the underfloor of the railway vehicle. Using two of the partition wall units, the interior of the chassis is divided into three compartments in the lengthwise direction. Filter capacitors are respectively arranged near the left and right ends of the chassis, and two control units are arranged in the center. Moreover, inverter units are arranged respectively facing the two filter capacitors.

RELATED ART DOCUMENTS

Patent Documents

Patent Document 1: Japanese Patent Application Laid-Open Publication No. 2009-96460

SUMMARY OF THE INVENTION

In the conventional technology disclosed in Patent Document 1, the hanging lugs which serve as holding fixtures to be attached to the underfloor of the railway vehicle are fixed to the top wall unit using rivets. The railway vehicle experiences oscillations in the lengthwise direction of the vehicle due to acceleration and braking and also experiences oscillations in the widthwise direction of the vehicle due to traveling through curves and over railroad switch points. Due to transmission of these oscillations to the chassis suspended from the underfloor and the high weight of the chassis itself, the hanging lugs are subjected to large oscillatory loads in the lengthwise direction of the vehicle and the widthwise direction of the vehicle. Withstanding these oscillatory loads requires a large number of the hanging lugs to be arranged, which results in an increase in assembly time, higher production costs, and an inability to satisfy weight reduction requirements.

Therefore, the power converter according to the present invention was made in view of the problems in the conventional technology described above and aims to provide a power converter which makes it possible to reliably mount a chassis in a suspended manner using a small number of holding fixtures.

Additional or separate features and advantages of the invention will be set forth in the descriptions that follow and in part will be apparent from the description, or may be learned by practice of the invention. The objectives and other advantages of the invention will be realized and attained by the structure particularly pointed out in the written description and claims thereof as well as the appended drawings.

To achieve these and other advantages and in accordance with the purpose of the present invention, as embodied and broadly described, in one aspect, the present disclosure provides a power converter to be mounted on a mounting portion of a host in a suspended manner, including: a chassis enclosing parts of the power converter, the chassis having attached thereto a holding fixture for mounting the chassis to the mounting portion, wherein the holding fixture includes: a first member attached to a first surface of the chassis that will face the mounting portion when the power converter is mounted; and a second member attached to the first member and attached to a second surface of the chassis that adjoins the first surface of the chassis.

This one aspect of the present invention makes it possible to attach the holding fixture to the chassis both at the first surface facing the mounting portion and at the second surface adjoining the first surface, thereby providing sufficient strength against lengthwise and widthwise oscillatory loads transmitted to the chassis and making it possible to mount the chassis in a suspended manner using a small number of the holding fixtures.

It is to be understood that both the foregoing general description and the following detailed description are exemplary and explanatory, and are intended to provide further explanation of the invention as claimed.

DETAILED DESCRIPTION OF EMBODIMENTS

Embodiments of a power converter according to the present invention will be described with reference to figures. Note that the figures are only schematic illustrations and may be different from the actual components. Moreover, the embodiments described below are only examples of devices or methods for implementing the technical concepts of the present invention and do not limit the configuration of the invention to the configurations presented below. In other words, the technical concepts of the present invention allow for various modifications to be made within the technical scope defined by the claims.

First, Embodiment 1 of the power converter according to the present invention will be described.

Figure 1:
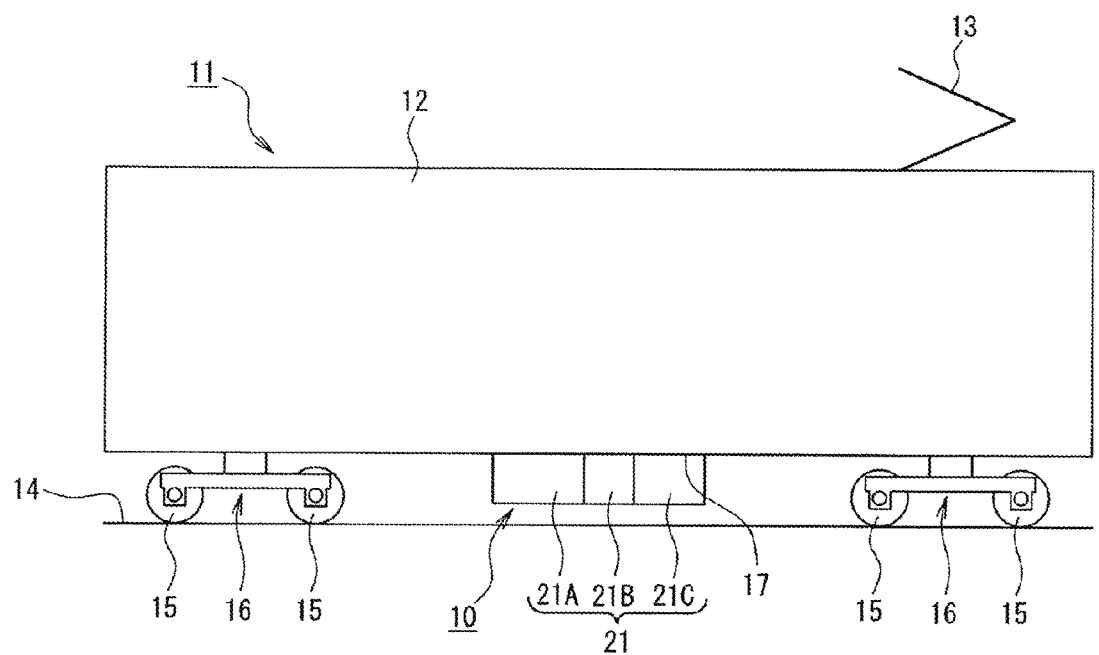
FIG. 1 is a side view illustrating a railway vehicle equipped with a power converter according to the present invention.

As illustrated in FIG. 1, in a railway vehicle 11 equipped with a power converter 10 according to the present invention, a pantograph 13 is installed on top of a vehicle body 12. Carts 16 which support wheels 15 respectively rotatably-contacting rails 14 on both lateral sides of the vehicle relative to the direction of travel are mounted on the underfloor of the vehicle body 12.

A chassis 21 of the power converter 10 is mounted in a suspended manner to a mounting portion 17 between the carts 16 on the underfloor of the vehicle body 12. This power converter 10 supplies electric power for use within the railway vehicle 11.

Figure 2:
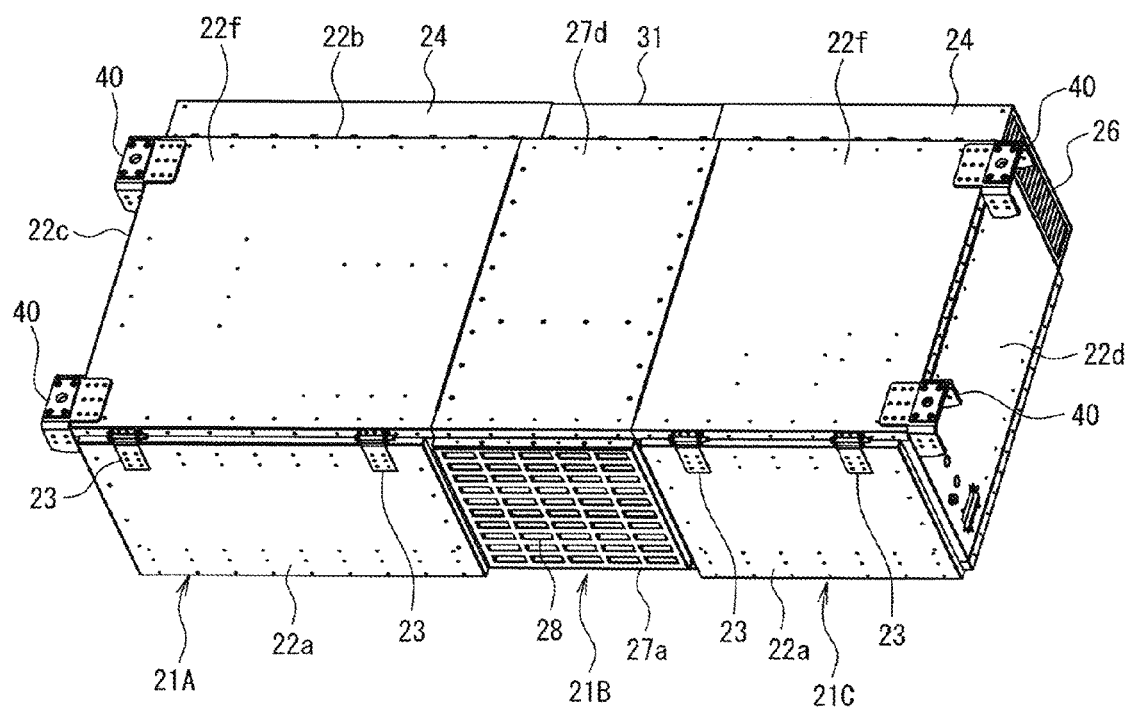
FIG. 2 is a perspective view illustrating an overall configuration of the power converter according to the present invention.

As illustrated in FIG. 2, the power converter 10 includes three enclosures connected together parallel to the movement direction of the vehicle: a first enclosure 21A, a second enclosure 21B, and a third enclosure 21C. Here, assuming that the railway vehicle 11 is an AC electric train, the first enclosure 21A houses a converter which converts single-phase AC supplied from the pantograph 13 via a transformer to DC, for example. Alternatively, if the railway vehicle 11 is a DC electric train, the first enclosure 21A houses a converter which steps up or steps down the DC voltage, for example. The second enclosure 21B houses components such as the transformer and a reactor, an intake fan which draws in outside air as a cooling medium, and the like. The third enclosure 21C houses an inverter which converts the DC output from the converter to three-phase alternating current.

Figure 3:
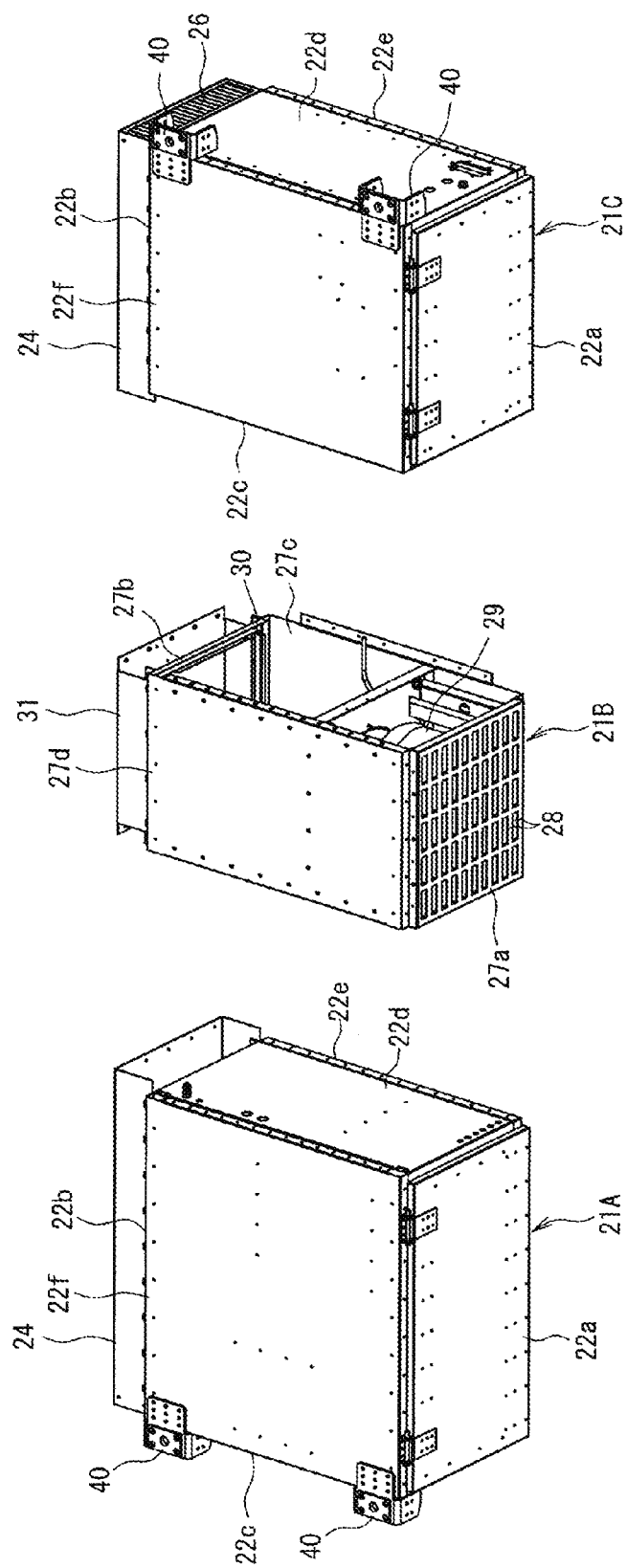
FIG. 3 is an exploded perspective view of the configuration illustrated in FIG. 2.
Figure 5A:
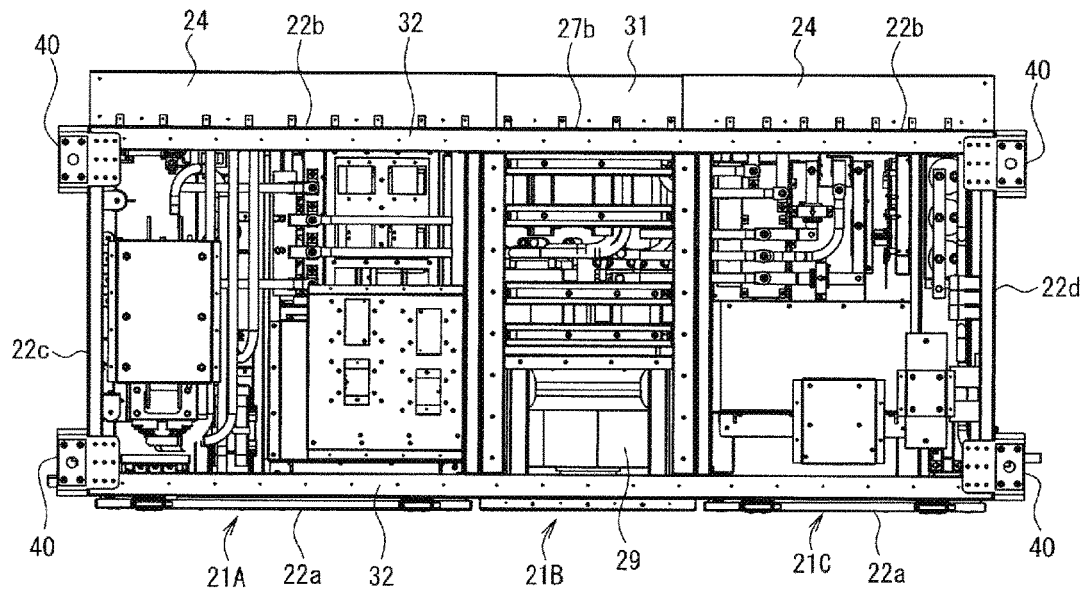
FIG. 5A is a plan view of the configuration illustrated in FIG. 4.
Figure 5B:
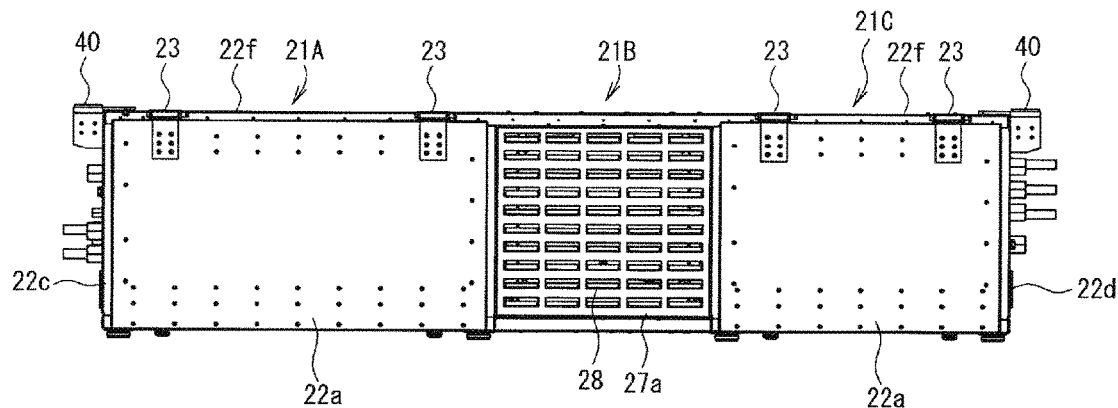
FIG. 5B is a front view of the same.
Figure 5C:
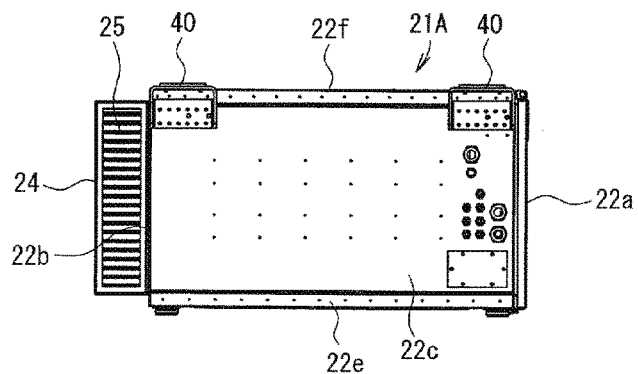
FIG. 5C is a left side view of the same.

As illustrated in FIG. 3, the first enclosure 21A and the third enclosure 21C are formed as rectangular prisms respectively including a front plate 22a, a rear plate 22b, a left side plate 22c, a right side plate 22d, a bottom plate 22e, and a top plate 22f. Here, the front plate 22a has the top edge side thereof fixed by hinges 23 and functions as an opening/closing door. The rear plate 22b has a vent (not illustrated in the figure) formed therein, and an air duct 24 is arranged on the outer side of this vent. As illustrated in FIG. 5C, in the first enclosure 21A, an air intake 25 in which a large number of slits are formed is formed in the left end of the air duct 24. In the third enclosure 21C, an air intake 26 in which a large number of slits are formed is formed in the right end of the air duct 24.

As illustrated in FIG. 3, the second enclosure 21B does not include a left side plate or a right side plate, and a front plate 27a, a rear plate 27b, a bottom plate 27c, and a top plate 27d are used to form a rectangular prism shape in which the left side face and right side face are open. An exhaust vent 28 in which a large number of slits are formed is formed in the front plate 27a. An exhaust fan 29 is arranged on the inside facing the exhaust vent 28. Moreover, a large vent 30 is formed in the rear plate 27b, and an air duct 31 is arranged covering this vent 30. The left and right ends of the air duct 31 are respectively connected to the air ducts 24 of the first enclosure 21A and the third enclosure 21C.

Figure 4:
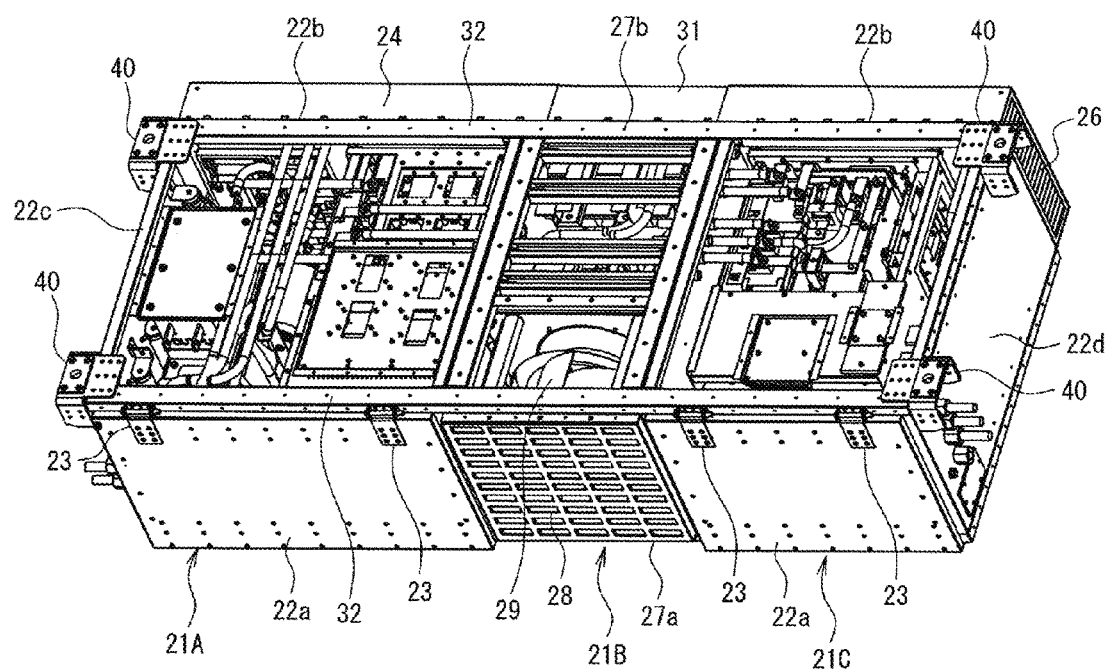
FIG. 4 is a perspective view of the configuration illustrated in FIG. 2 in a state in which top plates have been removed.

The first enclosure 21A, the second enclosure 21B, and the third enclosure 21C are riveted together along the left and right side faces thereof serving as joining positions therebetween. Moreover, as illustrated in FIGS. 4 to 5C, reinforcing frames 32 which extend from the first enclosure 21A through the second enclosure 21B and into the third enclosure 21C are fixed to the first enclosure 21A, the second enclosure 21B, and the third enclosure 21C near the front and rear edges of the bottom surface side of the top plates 22f (underneath the top plate 22f). These reinforcing frames 32 are lipped channel (C-channel) steel, for example.

Holding fixtures 40 which serve as hanging lugs for suspending the enclosures from the underfloor of the vehicle body 12 of the railway vehicle 11 are respectively fixed to positions near the ends in the width direction (the front-rear direction) of the left edge side of the top plate 22f of the first enclosure 21A and to positions near the ends in the width direction (the front-rear direction) of the right edge side of the top plate 22f of the third enclosure 21C.

As illustrated in FIGS. 6A to 9, each holding fixture 40 includes a first member 41 and a second member 42 which has a U-shape when viewed in a plan view. The first member 41 is fixed to the top plate 22f (a first surface) of the first enclosure 21A or the third enclosure 21C. The second member 42 is fixed to the first member 41 and to the left side plate 22c or the right side plate 22d (a second surface) adjoining the top plate 22f of the first enclosure 21A or the third enclosure 21C.

Figure 9:
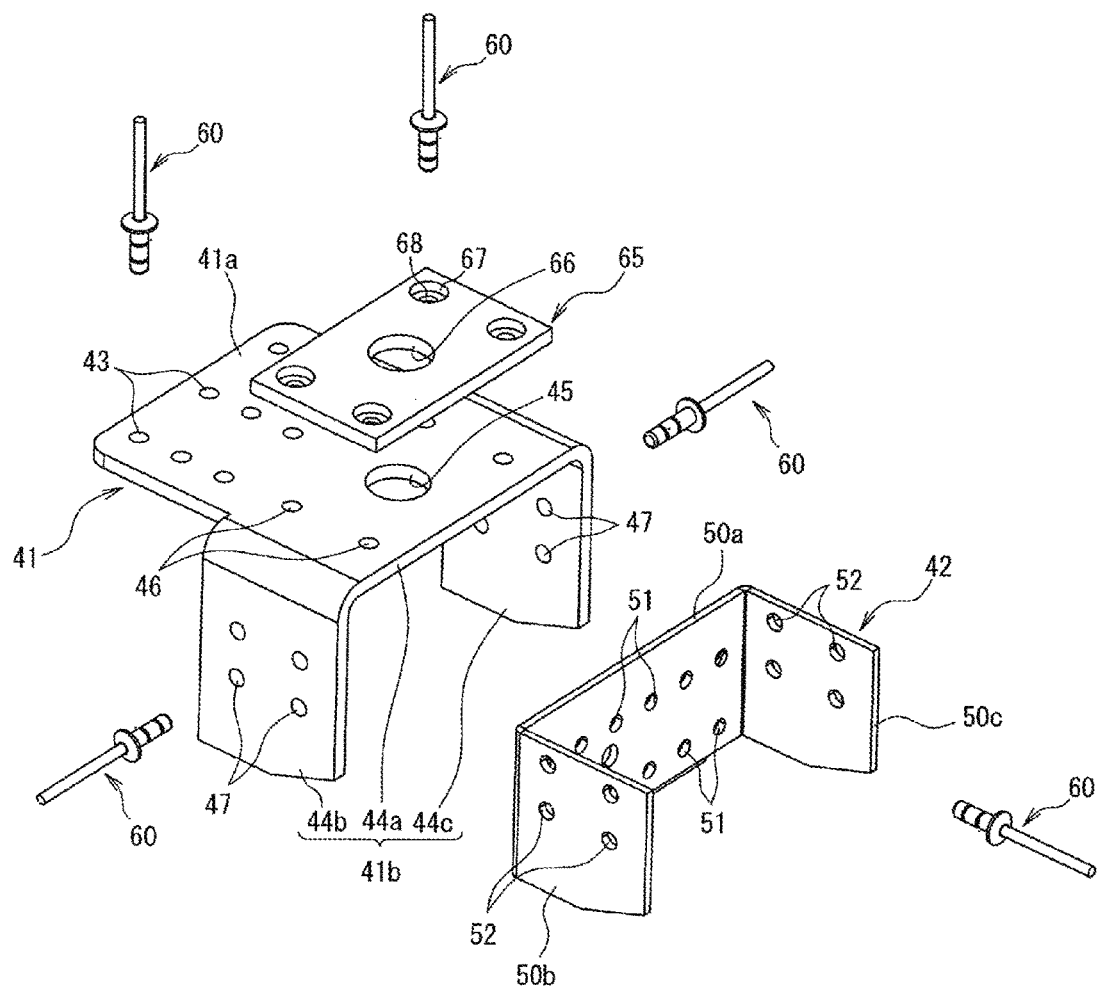
FIG. 9 is an exploded perspective view of the holding fixture.

As illustrated larger in FIG. 9, the first member 41 includes a first attaching portion 41a having a flat plate shape and a second attaching portion 41b having an inverted U-shape when viewed in a side view, which are formed in an integrated manner. The first attaching portion 41a is fixed to the top plate 22f (first surface) of the first enclosure 21A and the third enclosure 21C. In the first attaching portion 41a, nine rivet holes 43 are formed, for example.

The second attaching portion 41b is formed protruding out from the end of the first attaching portion 41a on the left side plate 22c or right side plate 22d (second surface) side. This second attaching portion 41b includes a first intermediate plate portion 44a, a first bent plate portion 44b, and a second bent plate portion 44c, which form an inverted U-shape when viewed in a side view. The first intermediate plate portion 44a is formed having a flat plate shape which connects with the first attaching portion 41a. The first bent plate portion 44b and the second bent plate portion 44c are formed by bending a pair of sides of the first intermediate plate portion 44a opposite to one another in the width direction downwards at right angles so as to face one another.

In addition, a bolt hole 45 for inserting a bolt for attaching to the vehicle body 12 is formed in the center of the first intermediate plate portion 44a, and rivet holes 46 are formed at four locations, for example, around this bolt hole 45. Rivet holes 47 are formed facing one another at four locations, for example, in the first bent plate portion 44b and the second bent plate portion 44c.

As illustrated larger in FIG. 9, the second member 42 includes a second intermediate plate portion 50a having a flat plate shape with vertically-oriented surfaces, and a third bent plate portion 50b and a fourth bent plate portion 50c which are respectively bent backwards at right angles from the left and right ends of the second intermediate plate portion 50a so as to face one another.

Rivet holes 51 are formed at a total of 12 locations (six upper locations and six lower locations) in the second intermediate plate portion 50a. In the third bent plate portion 50b and the fourth bent plate portion 50c, rivet holes 52 are formed at positions facing the rivet holes 47 in the first bent plate portion 44b and second bent plate portion 44c of the first member.

Moreover, the first member 41 and the second member 42 are joined together into a single component to form the holding fixture 40. In other words, the second member 42 is inserted into the second attaching portion 41b of the first member 41. Here, the second intermediate plate portion 50a is oriented toward the first attaching portion 41a side, and the outer surfaces of the third bent plate portion 50b and the fourth bent plate portion 50c are respectively brought into contact with the inner surfaces of the first bent plate portion 44b and the second bent plate portion 44c. In this state, the rivet holes 47 are positioned so as to align with the rivet holes 52. Therefore, the first attaching portion 41a of the first member 41 and the second intermediate plate portion 50a of the second member 42 form an L-shape when viewed in a side view. Then, blind rivets 60 are inserted from the outer sides of the first bent plate portion 44b and the second bent plate portion 44c of the second attaching portion 41b of the first member 41 and fastened in place.

Figure 10:
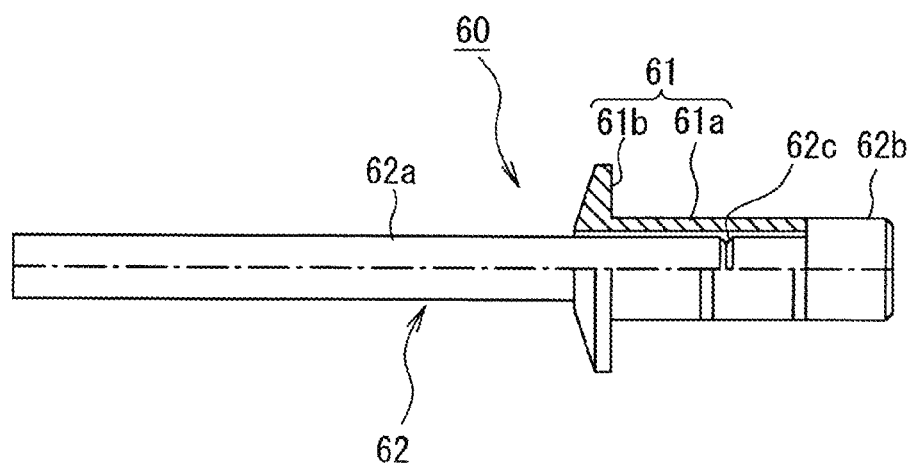
FIG. 10 is an enlarged side view illustrating a cross-section of a blind rivet.

As illustrated in FIG. 10, each blind rivet 60 includes a hollow rivet body 61 and a mandrel 62 which is inserted through this rivet body 61 (both of which are made of metal). The rivet body 61 includes a cylinder portion 61a and a flange 61b formed on one end of the cylinder portion 61a.

The mandrel 62 includes a shaft 62a which goes through the rivet body 61 and extends outwards from the flange 61b side and a head portion 62b formed on the side of the shaft 62a opposite to the flange 61b of the cylinder portion 61a of the rivet body 61. The head portion 62b is formed to have a greater diameter than the inner diameter of the cylinder portion 61a. A small-diameter breaking portion 62c is formed in the shaft 62a of the mandrel 62 at an intermediate position within the cylinder portion 61a of the rivet body 61 in the axial direction.

To use these blind rivets 60, two plate members to be joined are brought into planar contact with one another, and then rivet holes are formed facing one another. Then, with the two plate members positioned such that the rivet holes align with one another, the mandrel 62 is inserted, with its head portion 62b side first, into the rivet holes from one side thereof. Next, the flange 61b of the rivet body 61 is brought into contact with the plate member on the insertion side, which causes the head portion 62b of the mandrel 62 to protrude out from the other side of the rivet holes. In this state, the end of the shaft 62a of the mandrel 62 protruding out from the flange 61b of the rivet body 61 is pulled out using a fastening tool (not illustrated in the figures). As a result, the head portion 62b of the mandrel 62 causes buckling deformation in the cylinder portion 61a on the side opposite to the flange 61b of the rivet body 61, thereby forming an expanded portion which protrudes outwards. When formation of this expanded portion is complete, the mandrel 62 is broken off at the small-diameter breaking portion 62c formed in the shaft 62a, thereby completing the rivet joint.

Furthermore, the blind rivets 60 are similarly used to fasten a gap-adjusting plate 65 to the top surface of the first intermediate plate portion 44a of the second attaching portion 41b of the first member 41. As illustrated in FIG. 9, in the gap-adjusting plate 65, a bolt hole 66 and rivet holes 67 are formed respectively facing the bolt hole 45 and the rivet holes 46 formed in the first intermediate plate portion 44a of the second attaching portion 41b. Here, counterbores 68 are formed in the top surface sides of the rivet holes 67. Therefore, when the gap-adjusting plate 65 is fixed to the first intermediate plate portion 44a of the second attaching portion 41b using the blind rivets 60, the flanges 61b of the blind rivets 60 do not protrude up from the top surface of the gap-adjusting plate 65.

First members 41 and second members 42 are thus joined together in this manner to form the holding fixtures 40. As illustrated in FIG. 2, these holding fixtures 40 are riveted to the top plate 22f (first surface) and to the left side plate 22c (second surface) of the first enclosure 21A using the blind rivets 60. Similarly, the holding fixtures 40 are riveted to the top plate 22f (first surface) and to the right side plate 22d (second surface) of the third enclosure 21C using the blind rivets 60.

Figure 6A:
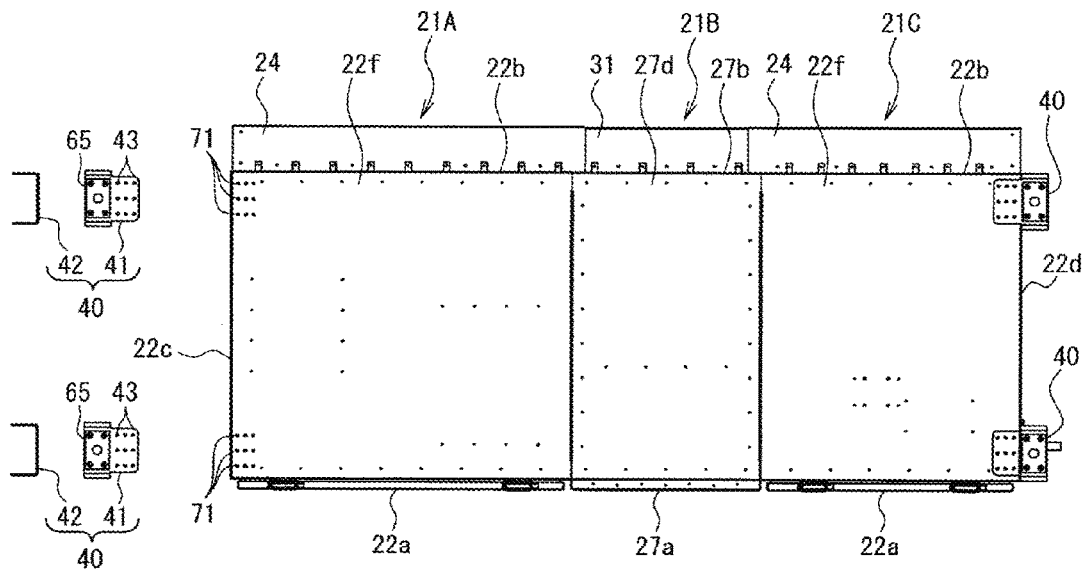
FIG. 6A is a plan view illustrating a state prior to holding fixtures being attached to a first enclosure.
Figure 6B:
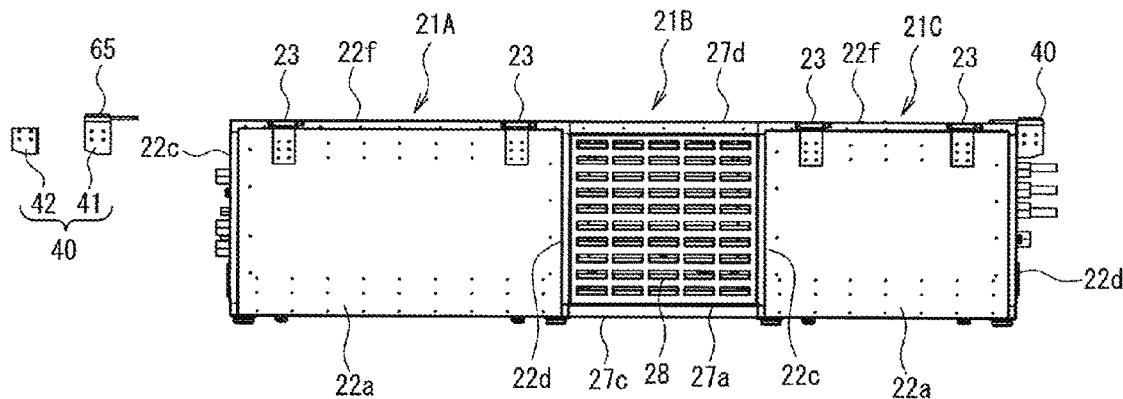
FIG. 6B is a front view of the same.
Figure 6C:
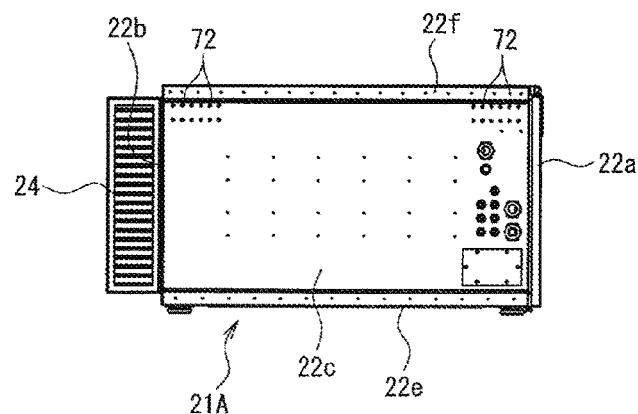
FIG. 6C is a left side view of the same.

In order to do so, as illustrated in FIG. 6A, rivet holes 71 corresponding to the rivet holes 43 formed in the first attaching portion 41a of the first member 41 are formed in the top plate 22f (first surface) at holding fixture attachment positions on the first enclosure 21A. Moreover, rivet holes 72 corresponding to the rivet holes 51 formed in the second intermediate plate portion 50a of the second member 42 are formed in the left side plate 22c (second surface).

Figure 7:
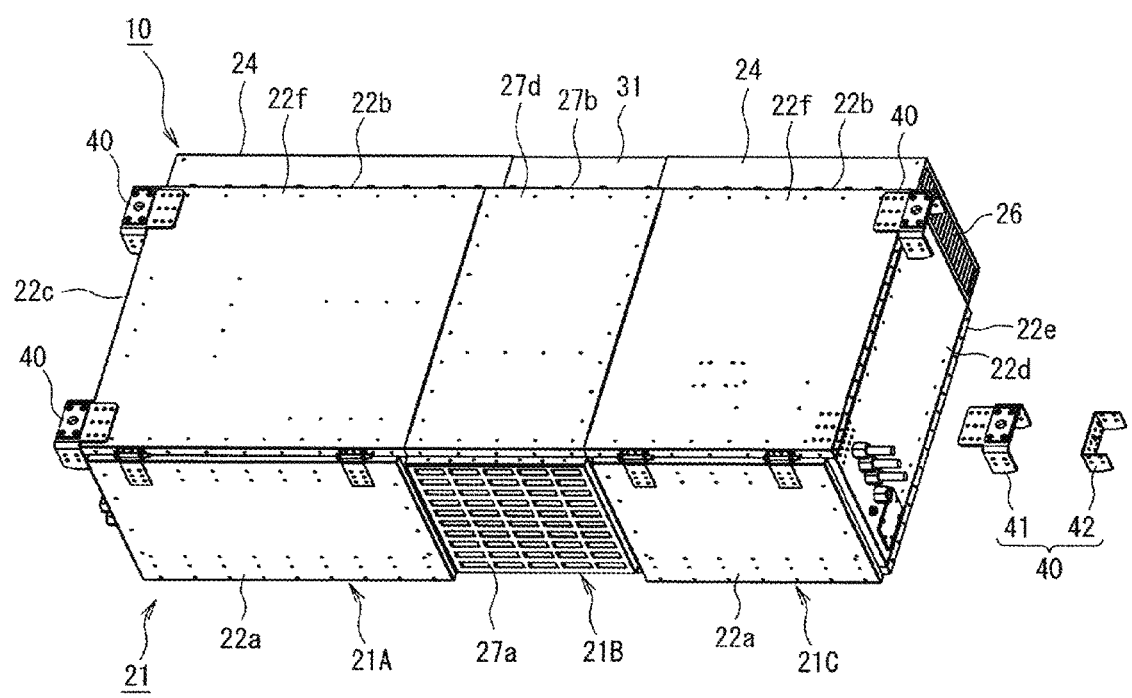
FIG. 7 is an exploded perspective view illustrating a state prior to a holding fixture being attached to a third enclosure.
Figure 8:
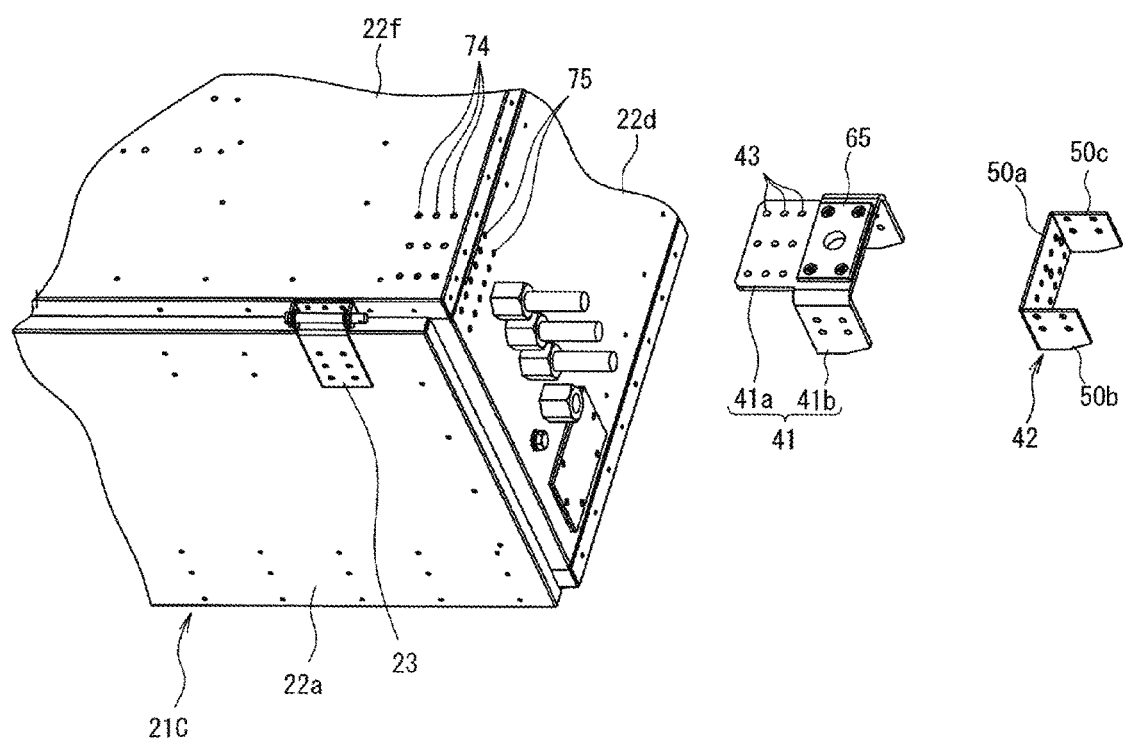
FIG. 8 is an enlarged perspective view of the primary components in FIG. 7.

Similarly, as illustrated in FIGS. 7 and 8, rivet holes 74 corresponding to the rivet holes 43 formed in the first attaching portion 41a of the first member 41 are formed in the top plate 22f (first surface) at holding fixture attachment positions on the third enclosure 21C. Moreover, rivet holes 75 corresponding to the rivet holes 51 formed in the second intermediate plate portion 50a of the second member 42 are formed in the right side plate 22d (second surface).

Next, a method of assembling the power converter 10 will be described.

First, as illustrated in FIG. 4, the first enclosure 21A housing the converter; the second enclosure 21B housing components such as the exhaust fan 29, the transformer, and the reactor; and the third enclosure 21C housing the inverter are prepared. Next, the first enclosure 21A, the second enclosure 21B, and the third enclosure 21C are arranged adjacent to one another in that order with the top plates 22f and 27d removed, and the first enclosure 21A, the second enclosure 21B, and the third enclosure 21C are fixed together using rivets, for example. In this state, the elongated reinforcing frames 32 are fixed to positions near the ends in the width direction of the top sides of the first enclosure 21A, the second enclosure 21B, and the third enclosure 21C using rivets, for example.

Figure 11:
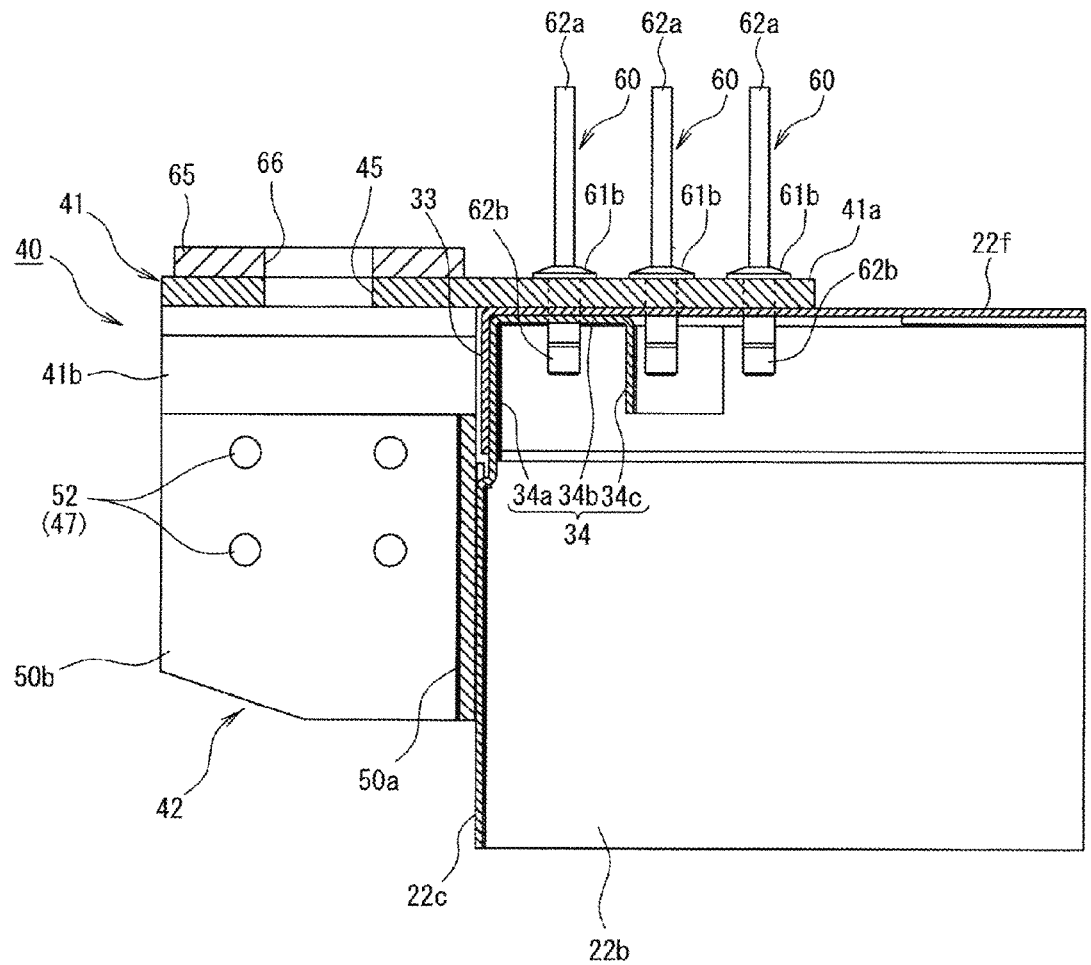
FIG. 11 is an enlarged cross-sectional view illustrating how the holding fixture is mounted.

Here, as illustrated in FIG. 11, a bent plate portion 33 is formed by bending the left edge side of the top plate 22f of the first enclosure 21A downwards. Meanwhile, as illustrated in FIGS. 4 and 11, a reinforcing frame 34 with an inverted U-shaped cross-section is formed integrated with the left side plate 22c. This reinforcing frame 34 includes a first plate portion 34a, a first bent plate portion 34b, and a second bent plate portion 34c. The first plate portion 34a forms a stair portion which accommodates the bent plate portion 33 near the top plate 22f side of the left side plate 22c. The first bent plate portion 34b is bent backwards from the top edge of the first plate portion 34a and runs along the inner surface of the top plate 22f. The second bent plate portion 34c is bent downwards from the right edge of the first bent plate portion 34b.

Moreover, although not explicitly illustrated in the figures, a similar bent plate portion and reinforcing frame are formed in the top plate 22*f* and the right side plate 22*d* of the third enclosure 21C as well.

Then, the top plates 22*f* are fixed to the first enclosure 21A and the third enclosure 21C using rivets, for example. Moreover, the top plate 27*d* is fixed to the second enclosure 21B using rivets, for example. In this way, the first enclosure 21A, the second enclosure 21B, and the third enclosure 21C are connected together to form the chassis 21.

Next (or before the above steps), the holding fixtures 40 are fixed to the top plate 22*f* and the left side plate 22*c* at positions near the front and rear ends of the first component-housing enclosure 21A.

To attach these holding fixtures 40 to the first enclosure 21A, the rivet holes 43 formed in the first attaching portion 41*a* of the first member 41 of each holding fixture 40 are aligned with the rivet holes 71 formed in the top plate 22*f*. Meanwhile, the rivet holes 51 formed in the second intermediate plate portion 50*a* of the second member 42 of each holding fixture 40 are aligned with the rivet holes 72 formed in the left side plate 22*c*.

In this state, the head portions 62*b* of the mandrels 62 of the blind rivets 60 are inserted into the rivet holes 71 and 43 from the outer side of the top plate 22*f*, and the flanges 61*b* are brought into contact with the surface of the first attaching portion 41*a* of the first member 41 of each holding fixture 40. Here, as illustrated in FIG. 11, the head portions 62*b* of the mandrels 62 of the blind rivets 60 and the distal ends of the cylinder portions 61*a* of the rivet bodies 61 protrude out from the back surface (inner surface) of the top plate 22*f* or from the top plate 22*f* and the back surface (inner surface) of the first bent plate portion 34*b* of the left side plate 22*c*.

In this state, the shafts 62*a* of the mandrels 62 are pulled outwards using the fastening tool (not illustrated in the figures). Due to this, the head portions 62*b* cause the cylinder portions 61*a* of the rivet bodies 61 to undergo buckling deformation on the inner surface side of the top plate 22*f* or the inner surface side of the first bent plate portion 34*b*, thereby forming expanded portions which expand outwards. As a result, the top plate 22*f* or the top plate 22*f* and first bent plate portion 34*b* are fixed to the first member 41 of the holding fixture 40 by the rivet bodies 61. Then, each mandrel 62 is broken off at the small-diameter breaking portion position on the shaft 62*a*.

Similarly, in the second intermediate plate portion 50*a* of the second member 42 of the holding fixture 40 and the left side plate 22*c* (the second surface), the head portions 62*b* of the blind rivets 60 are inserted from the outer side into the rivet holes 51 and 72 in a similar manner. Then, the shafts 62*a* of the mandrels 62 are pulled outwards using the fastening tool, thereby fastening together the second intermediate plate portion 50*a* and the left side plate 22*c* by the rivet bodies 61.

Following a similar procedure, the holding fixtures 40 are also fixed to the top plate 22*f* and the right side plate 22*d* at positions near the front and rear ends of the third enclosure 21C using the blind rivets 60.

Then, the chassis 21 to which the holding fixtures 40 have been attached is bolted into place with the top surfaces of the gap-adjusting plates 65 contacting L-shaped brackets, for example (not illustrated in the figures), formed on the underfloor of the vehicle body 12 of the railway vehicle 11, thereby making it possible to fix the chassis 21 to the underfloor of the vehicle body 12 in a suspended manner.

Thus, in Embodiment 1 as described above, the holding fixtures 40 are formed by joining together the first members 41 and the second members 42 and are then fixed to the top plate 22*f* (first surface) and the left side plate 22*c* (second surface) of the first enclosure 21A. Similarly, the holding fixtures 40 are fixed to the top plate 22*f* (first surface) and the right side plate 22*d* (second surface) of the third enclosure 21C. This makes it possible to robustly fix the holding fixtures 40 to the first surfaces and second surfaces respectively adjoining one another in the first enclosure 21A and the third enclosure 21C. Therefore, even when oscillatory loads resulting from oscillation in the lengthwise direction of the vehicle or oscillation in the widthwise direction of the vehicle due to acceleration and deceleration of the vehicle body 11 are transmitted to the holding fixtures 40, it is possible to maintain sufficient mechanical strength.

As a result, even if the chassis 21 is long in the lengthwise direction of the railway vehicle 11 after the first enclosure 21A, the second enclosure 21B, and the third enclosure 21C are joined together, the number of holding fixtures 40 installed can be kept to a minimum of four. This makes it possible to reduce the weight of the power converter (that is, including the holding fixtures 40) and also makes it possible to reduce production costs.

Moreover, the blind rivets 60 are used to join together the first member 41 and the second member 42 of each holding fixture 40 and to fix the holding fixtures 40 to the first enclosure 21A and the third enclosure 21C. This makes it possible to reduce assembly time and also makes it possible to perform the fastening work from a single direction as well as to complete the assembly process easily and reliably.

It should also be noted that assembly of the holding fixtures 40 and attachment of the holding fixtures 40 to the first enclosure 21A and the third enclosure 21C can be performed using welded joints. However, when using welded joints, the heat used during welding can cause the holding fixtures 40 or the first enclosure 21A and the third enclosure 21C to deform, or welding defects can cause cracks to develop, both of which make it difficult to maintain sufficient mechanical strength. However, Embodiment 1 makes it possible to achieve sufficient mechanical strength by using rivet joints as described above.

Furthermore, joining together the first members 41 and the second members 42 in advance to form the holding fixtures 40 makes it possible to assemble the holding fixtures 40 in a process separate from the chassis assembly process. This makes it possible to simplify attachment of the holding fixtures 40 to the first enclosure 21A and the third enclosure 21C.

In addition, in Embodiment 1 the holding fixtures 40 are installed at the lengthwise ends of the chassis 21, and therefore the holding fixtures 40 do not need to be installed anywhere other than at the lengthwise ends of the chassis 21. Therefore, with the power converter 10 suspended from the underfloor of the vehicle body 12 of the railway vehicle 11 and oriented running in the direction of travel, opening/closing doors can be arranged so as to be openable/closeable from the sides of the vehicle body 12, which makes it possible to more easily perform inspections and repairs on the power converter 10.

Next, Embodiment 2 of the power converter according to the present invention will be described with reference to FIGS. 12A to 13.

In Embodiment 2, the strength of the joints between the holding fixtures and the chassis is further increased.

Figure 12A:
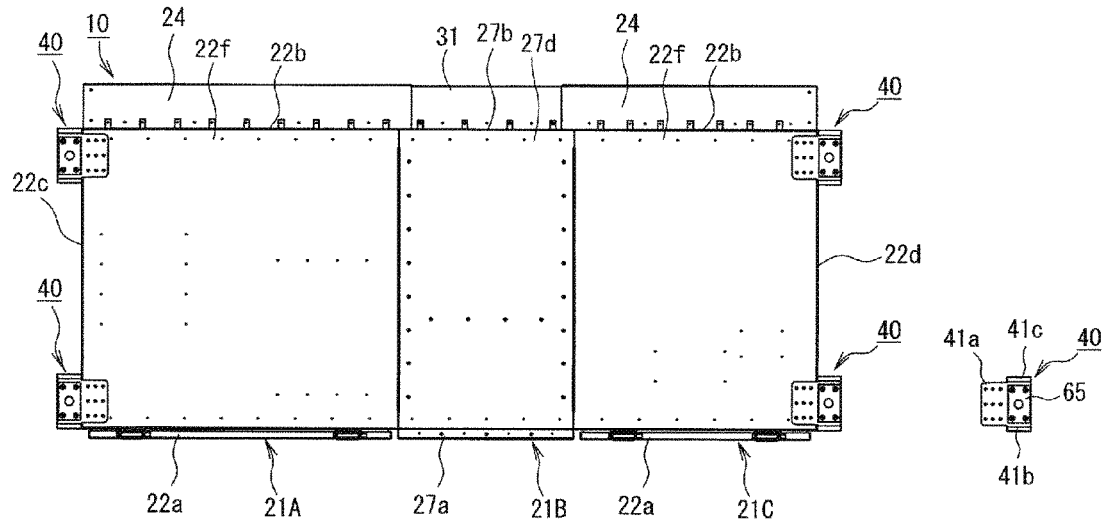
FIG. 12A is a plan view illustrating Embodiment 2 of the power converter according to the present invention.
Figure 12B:
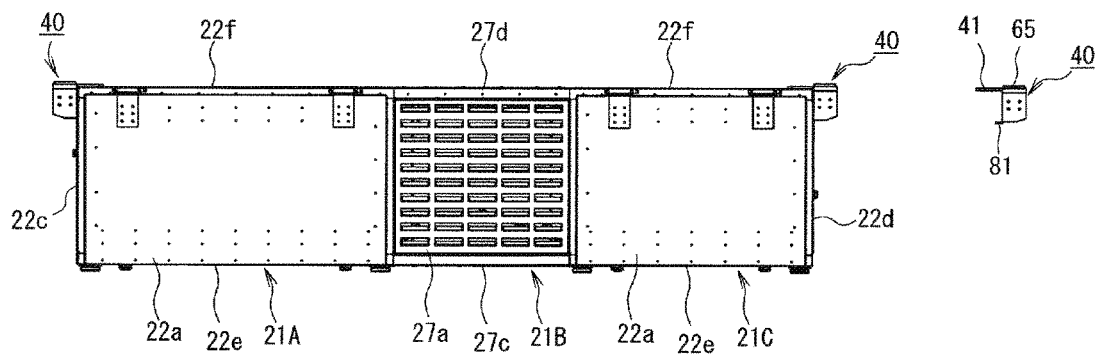
FIG. 12B is a front view of the same.
Figure 12C:
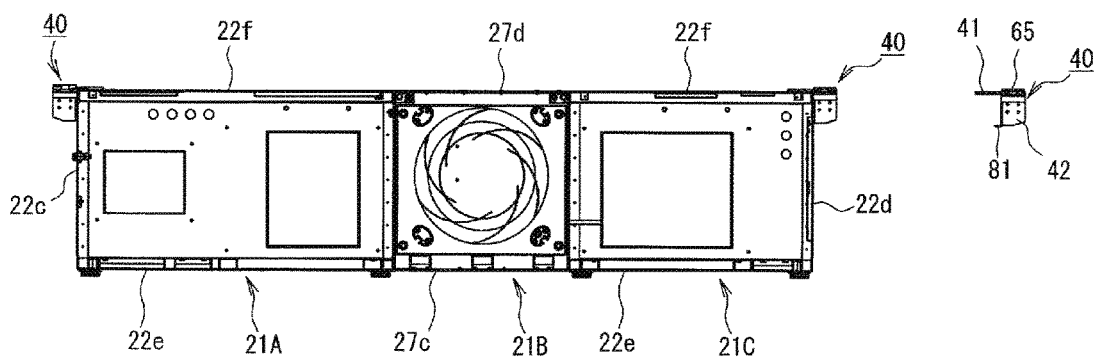
FIG. 12C is a cross-sectional view of the same.
Figure 13:
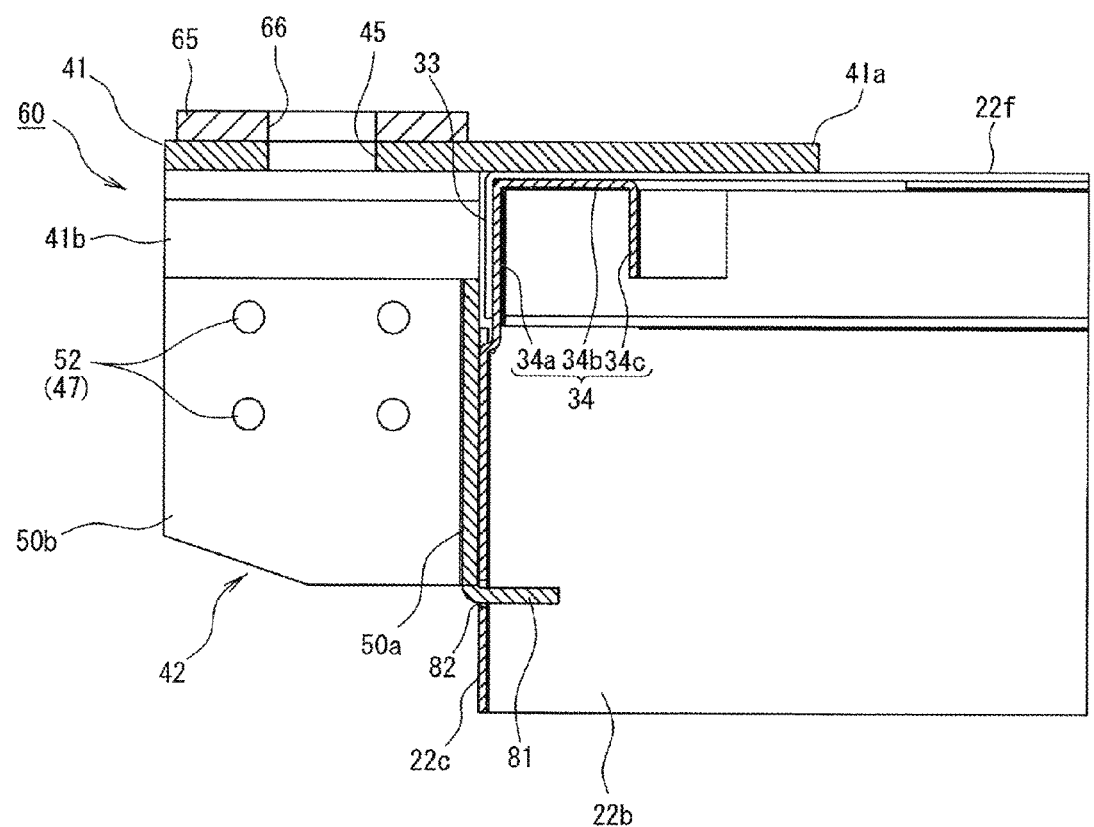
FIG. 13 is an enlarged cross-sectional view illustrating how the holding fixture illustrated in FIG. 11 is mounted.

In other words, as illustrated in FIGS. 12A to 13, in Embodiment 2 a hooking protrusion 81 which protrudes out opposite to the third bent plate portion 50*b* and the fourth bent plate portion 50*c* is formed near the bottom of the second intermediate plate portion 50a of the second member 42 of the holding fixture 40 from Embodiment 1.

Meanwhile, hooking holes 82 into which the respective hooking protrusions 81 can be hooked are formed beneath the rivet holes 72 in the left side plate 22c (the second surface) of the first enclosure 21A and the rivet holes 75 in the right side plate 22d (the second surface) of the third enclosure 21C to which the holding fixtures 40 will be attached.

The rest of the configuration is the same as in Embodiment 1 as described above. The same reference characters will be used for components corresponding to those in Embodiment 1, and detailed descriptions of such components will be omitted here.

In Embodiment 2 as illustrated in FIG. 13, with the first member 41 of the holding fixture 40 arranged running along the top plate 22f of the first enclosure 21A and the hooking protrusion 81 facing the hooking hole 82 in the left side plate 22c, the holding fixture 40 is moved into place such that the hooking protrusion 81 hooks into the hooking hole 82. This makes it possible to mount the holding fixture 40 to the top plate 22f (first surface) and the left side plate 22c (second surface) of the first enclosure 21A. With the holding fixture 40 in this mounting state, the bottom surface of the first member 41 and the top surface of the hooking protrusion 81 sandwich the left side plate 22c, thereby making it possible to keep the holding fixture 40 in place.

In this state, similar to in Embodiment 1 as described above, the head portions 62b of the mandrels 62 of the blind rivets 60 are inserted into the holding fixture 40 from the outer side, and the flanges 61b of the rivet bodies 61 are brought into contact with the first member 41 or the second intermediate plate portion 50a of the second member 42. Then, the shafts 62a of the mandrels 62 are pulled outwards using the fastening tool (not illustrated in the figures) in order to make the cylinder portions 61a of the rivet bodies 61 undergo buckling deformation and expand outwards, thereby making it possible to form rivet joints.

The holding fixtures 40 can be fixed to the third enclosure 21C in a similar manner.

With the holding fixtures 40 fixed to the first enclosure 21A and the third enclosure 21C, the respective first members 41 and hooking protrusions 81 sandwich the left side plate 22c and the right side plate 22d, thereby reliably preventing movement of the holding fixtures 40 in the vertical direction. Moreover, the hooking protrusions 81 hook into the hooking holes 82 formed in the left side plate 22c and the right side plate 22d (the second surfaces), thereby also preventing movement in the front-rear direction. This makes it possible to further improve the mechanical strength of the state in which the holding fixtures 40 are fixed to the first enclosure 21A and the third enclosure 21C in comparison to in Embodiment 1.

Note that although in Embodiment 2 the hooking protrusion 81 is formed in the bottom face side of the second intermediate plate portion 50a of the second member 42, the present invention is not limited to this configuration. In other words, the hooking protrusion may be formed by making vertical cuts near the top of the second intermediate plate portion 50a and then bending in the direction opposite to the third bent plate portion 50b and the fourth bent plate portion 50c. In this case, the hooking holes 82 can be formed at facing positions in the left side plate 22c and the right side plate 22d.

Figure 14:
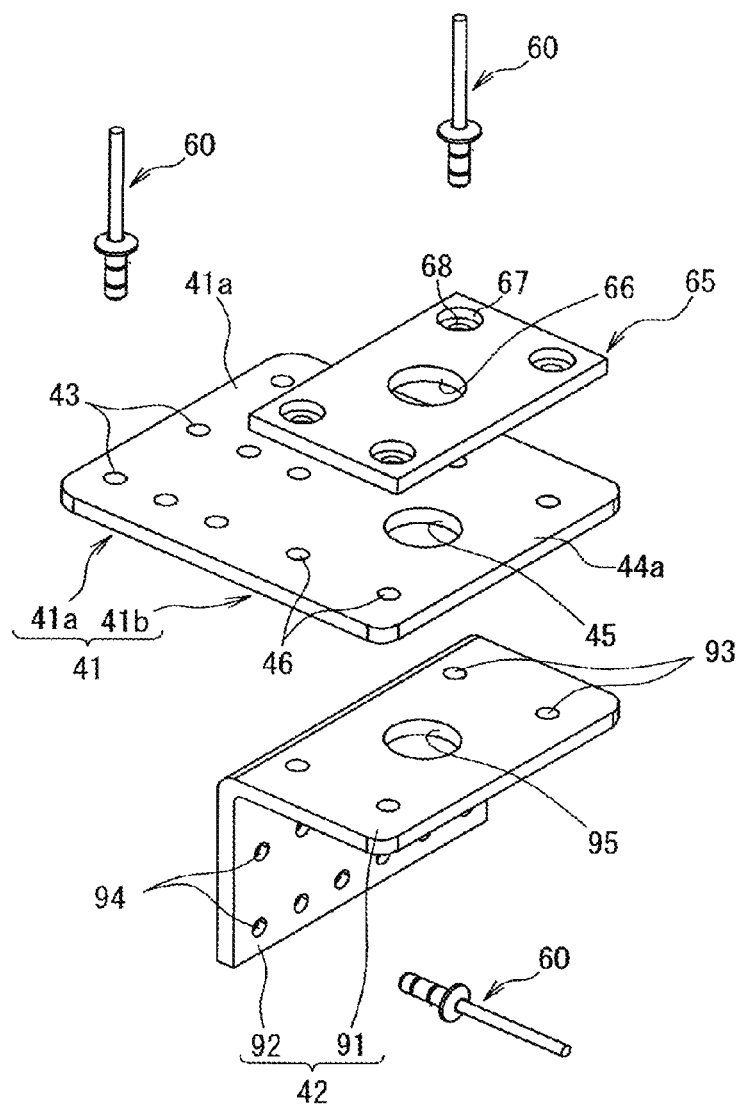
FIG. 14 is an exploded perspective view illustrating a modification example of a holding fixture that can be used in the present invention.

Moreover, the shapes of the first member 41 and the second member 42 forming the holding fixture 40 are not limited to those presented above in Embodiment 1 and 2, and a simplified configuration such as that illustrated in FIG. 14 can also be used.

More specifically, as illustrated in FIG. 14, here the second attaching portion 41b of the first member 41 of the holding fixture 40 includes only the first intermediate plate portion 44a and does not include the first bent plate portion 44b or the second bent plate portion 44c. Therefore, the first member 41 has a flat plate shape including the first attaching portion 41a and the second attaching portion 41b.

Moreover, as illustrated in FIG. 14, instead of being formed to have a U-shape when viewed in a plan view, the second member 42 of the holding fixture 40 includes a first flat plate portion 91 and a second flat plate portion 92 which are formed to have an L-shape when viewed in a side view. The first flat plate portion 91 is formed to have substantially the same length as the second attaching portion 41b of the first member 41 and is attached to that second attaching portion 41b. Moreover, the second flat plate portion 92 is attached to the left side plate 22c (second surface) of the first enclosure 21A or to the right side plate 22d (second surface) of the third enclosure 21C.

In the first flat plate portion 91, rivet holes 93 are formed at positions corresponding to the rivet holes 46 formed in the second attaching portion 41b of the first member 41. In the second flat plate portion 92, rivet holes 94 are formed corresponding to the rivet holes 72 or 75 formed in the left side plate 22c of the first enclosure 21A or the right side plate 22d of the third enclosure 21C. Moreover, a bolt hole 95 corresponding to the bolt hole 45 formed in the second attaching portion 41b of the first member 41 is formed in the first flat plate portion 91.

Furthermore, the second member 42 and the first member 41 are assembled so as to be substantially T-shaped when viewed in a side view, with the first flat plate portion 91 running along the second attaching portion 41b and the second flat plate portion 92 being arranged at an intermediate position of the first member. In this state, the second attaching portion 41b and the first flat plate portion 91 are fastened together using the blind rivets 60.

The first attaching portion 41a of the first member 41 of the holding fixture 40 configured as described above is brought into contact with the top plate 22f (first surface) of the first enclosure 21A, and the rivet holes 43 are aligned with the rivet holes 71. Moreover, the second flat plate portion 92 of the second member 42 is brought into contact with the left side plate 22c (second surface), and the rivet holes 94 are aligned with the rivet holes 72.

In this state, the head portions 62b of the mandrels 62 of the blind rivets 60 are inserted into the rivet holes 43 and 71 from the outer side, and the flanges 61b of the rivet bodies 61 are brought into contact with the top surface of the first attaching portion 41a. Next, the shafts 62a of the mandrels 62 are pulled outwards using the fastening tool (not illustrated in the figures) to make the cylinder portions 61a of the rivet bodies 61 undergo buckling deformation and expand outwards, and the shafts 62a then is broken off at the small-diameter breaking portions. This makes it possible to fasten together the first member 41 of the holding fixture 40 and the top plate 22f of the first enclosure 21A with the rivet bodies 61.

Similarly, the head portions 62b of the mandrels 62 of the blind rivets 60 are inserted into the rivet holes 94 and 72 from the outer side, and the flanges 61b of the rivet bodies 61 are brought into contact with the front surface of the second flat plate portion 92 of the second member 42. In this state, the shafts 62a of the mandrels 62 are pulled outwards using the fastening tool (not illustrated in the figures) to make the cylinder portions 61a of the rivet bodies 61 undergo buckling deformation and expand outwards, and the shafts 62a then is broken off at the small-diameter breaking portions. This makes it possible to fasten together the second member 42 of the holding fixture 40 and the left side plate 22c of the first enclosure 21A with the rivet bodies 61.

The holding fixtures 40 are then attached to the top plate 22f and the right side plate 22d of the third enclosure 21C using the blind rivets 60 in a similar manner.

Even with this type of holding fixture 40, the first member 41 and the second member 42 of each holding fixture 40 are still individually fixed to the top plate 22f (first surface) and the left side plate 22c (second surface) of the first enclosure 21A or to the top plate 22f (first surface) and the right side plate 22d (second surface) of the third enclosure 21C, thereby making it possible to achieve the same advantageous effects as in Embodiment 1 as described above.

As described above, here the first member 41 of the holding fixture 40 is formed to have a flat plate shape, and the second member 42 of the holding fixture 40 is formed to have an L-shape. This makes it possible to simplify the configuration of both the first member 41 and the second member 42 in comparison to in the holding fixture 40 of Embodiment 1 as described above, thereby making it possible to simplify the configuration of the overall holding fixture 40.

Even with this type of holding fixture 40, similar to in Embodiment 2, a hooking protrusion which protrudes in the direction opposite to the first flat plate portion 91 can be formed on the bottom face or left and right side faces of the second flat plate portion 92 of the second member 42, and hooking holes can be formed in the left side plate 22c of the first enclosure 21A and the right side plate 22d of the third enclosure 21C.

Moreover, the first member 41 and the second member 42 of the holding fixture 40 are not limited to being fastened together using the blind rivets 60, and the first member 41 and the second member may be fastened together with a standard rivet which is joined using caulking.

Furthermore, although in Embodiments 1 and 2 above the chassis 21 was described as including three enclosures (the first enclosure 21A, the second enclosure 21B, and the third enclosure 21C), the present invention is not limited to this configuration. In other words, the chassis 21 may be configured as a single long chassis equivalent to the first enclosure 21A to third enclosure 21C.

In addition, when the railway vehicle 11 is a DC electric train and the power converter does not require a converter for stepping up or stepping down the DC voltage, the power converter can be configured to include just the second enclosure 21B and the third enclosure 21C. Thus, the number of enclosures included in the chassis 21 can be set freely in accordance with the configuration of the railway vehicle.

Moreover, although in Embodiments 1 and 2 two of the holding fixtures 40 are attached to each lengthwise end of the chassis 21, the present invention is not limited to this configuration, and three or more of the holding fixtures 40 may be attached.

Furthermore, although in Embodiments 1 and 2 a first member 41 and a second member 42 are joined to form each holding fixture 40 and then these holding fixtures 40 are attached to the first enclosure 21A and the third enclosure 21C, the present invention is not limited to this method of assembly. In other words, the first members 41 (or the second members 42) may be attached to the first enclosure 21A and the third enclosure 21C, and then the second members 42 (or the first members 41) may be attached to the first enclosure 21A and the third enclosure 21C.

In addition, although in Embodiments 1 and 2 as described above the present invention was applied to a power converter for a railway vehicle which collects power from a pantograph installed on top of the vehicle body, the present invention is not limited to this application. The present invention may also be applied to a power converter for a third rail-type railway vehicle which collects power from a third rail via a collector shoe.

It will be apparent to those skilled in the art that various modifications and variations can be made in the present invention without departing from the spirit or scope of the invention. Thus, it is intended that the present invention cover modifications and variations that come within the scope of the appended claims and their equivalents. In particular, it is explicitly contemplated that any part or whole of any two or more of the embodiments and their modifications described above can be combined and regarded within the scope of the present invention.

What is claimed is:

1. A power converter to be mounted on a mounting portion of a host in a suspended manner, comprising:
    a chassis enclosing parts of the power converter, the chassis having attached thereto a holding fixture for suspending the chassis from the mounting portion, wherein the holding fixture includes:
    a first member attached to a first surface of the chassis that will face the mounting portion when the power converter is mounted; and
    a second member attached to the first member and attached to a second surface of the chassis that adjoins the first surface of the chassis.

2. The power converter according to claim 1,
    wherein the first member includes:
        a first attaching portion attached to the first surface, the first attaching portion being flat plate-shaped; and
        a second attaching portion formed having a U-shaped cross-section, the second attaching portion including:
            a first intermediate plate portion;
            a first bent plate portion; and
            a second bent plate portion,
        wherein the first intermediate plate portion is connected to the first attaching portion and protruding from a plane of the second surface outwardly, and the first bent plate portion and the second bent plate portion are bent from respective opposing sides of the first intermediate plate portion so that edges of the first and second bent plate portions run along the second surface.

3. The power converter according to claim 2, wherein the second member has a U-shape and includes a flat plate-shaped second intermediate plate portion and a mutually parallel third bent plate portion and fourth bent plate portion which are bent from respective opposing sides of the second intermediate plate portion.

4. The power converter according to claim 3, wherein the second member is joined to the first member in a state in which the third bent plate portion and the fourth bent plate portion contact the first bent plate portion and the second bent plate portion, respectively, of the first member, and in which the second intermediate plate portion meets the first intermediate plate portion of the first member at a right angle.

5. The power converter according to claim 1, wherein the first member includes:
   a first attaching portion attached to the first surface, the first attaching portion being flat plate-shaped; and
   a second attaching portion connected to the first attaching portion and protruding from a plane of the second surface outwardly,
   wherein the first attaching portion and the second attaching portion together form a flat-plate shape.

6. The power converter according to claim 5, wherein the second member includes a first flat plate portion attached to the second attaching portion of the first member and a second flat plate portion attached to the second surface so that the first and second flat plate portions together form an L-shape in a side view.

7. The power converter according to claim 1, wherein a hooking protrusion that hooks into a hooking hole formed in the second surface at a position separated from the first surface is formed on the second member.

8. The power converter according to claim 1, wherein the first member and the second member are joined using rivets.

9. The power converter according to claim 1, wherein the first member and the second member are joined to the chassis using rivets.

10. The power converter according to claim 9, wherein the rivets are blind rivets.

11. The power converter according to claim 1, wherein the holding fixture is provided in a plurality, and each of lengthwise ends of the chassis has a plurality of the holding fixtures attached thereto.

* * * * *